United States Patent [19]  [11] 4,139,143
Gumprecht  [45] Feb. 13, 1979

[54] WAVE SOLDER MACHINE

[75] Inventor: Lee C. Gumprecht, Albuquerque, N. Mex.

[73] Assignee: GTE Automatic Electric Laboratories, Inc., Northlake, Ill.

[21] Appl. No.: 855,053

[22] Filed: Nov. 25, 1977

[51] Int. Cl.² .......................... H05K 3/34; B23K 1/02
[52] U.S. Cl. ................................... 228/180 R; 228/37; 228/40
[58] Field of Search .................. 228/37, 40, 47, 180 R

[56] References Cited
U.S. PATENT DOCUMENTS

| 2,993,272 | 7/1961 | Carlzen et al. | 228/37 X |
| 3,421,211 | 1/1969 | Eaves et al. | 228/37 X |
| 3,655,173 | 4/1972 | Costello | 432/5 |
| 3,825,994 | 7/1974 | Coleman | 228/37 X |

OTHER PUBLICATIONS

"Special Flat-Flex Wire Belts for Continuous Processing," Catalog 72, Wire Belt Co. of America, 1972.

Primary Examiner—Al Lawrence Smith
Assistant Examiner—K. J. Ramsey
Attorney, Agent, or Firm—Russell A. Cannon

[57] ABSTRACT

A wave solder machine is provided which includes an endless moving mesh belt that is made of a nonsolderable material such as titanium wire. The belt is supported so as to be totally immersed in the solder wave as it passes the latter. This causes the undersides of stuffed printed circuit boards on the belt to be brought into contact with the molten solder. The belt wires preferably have a plurality of projections thereon to support the circuit boards above the major portion of the belt. In another machine, the circuit boards are moved along a plurality of parallel wires that pass through the solder wave. Alternatively, the wires themselves may be moving for carrying circuit boards across the solder wave.

20 Claims, 11 Drawing Figures

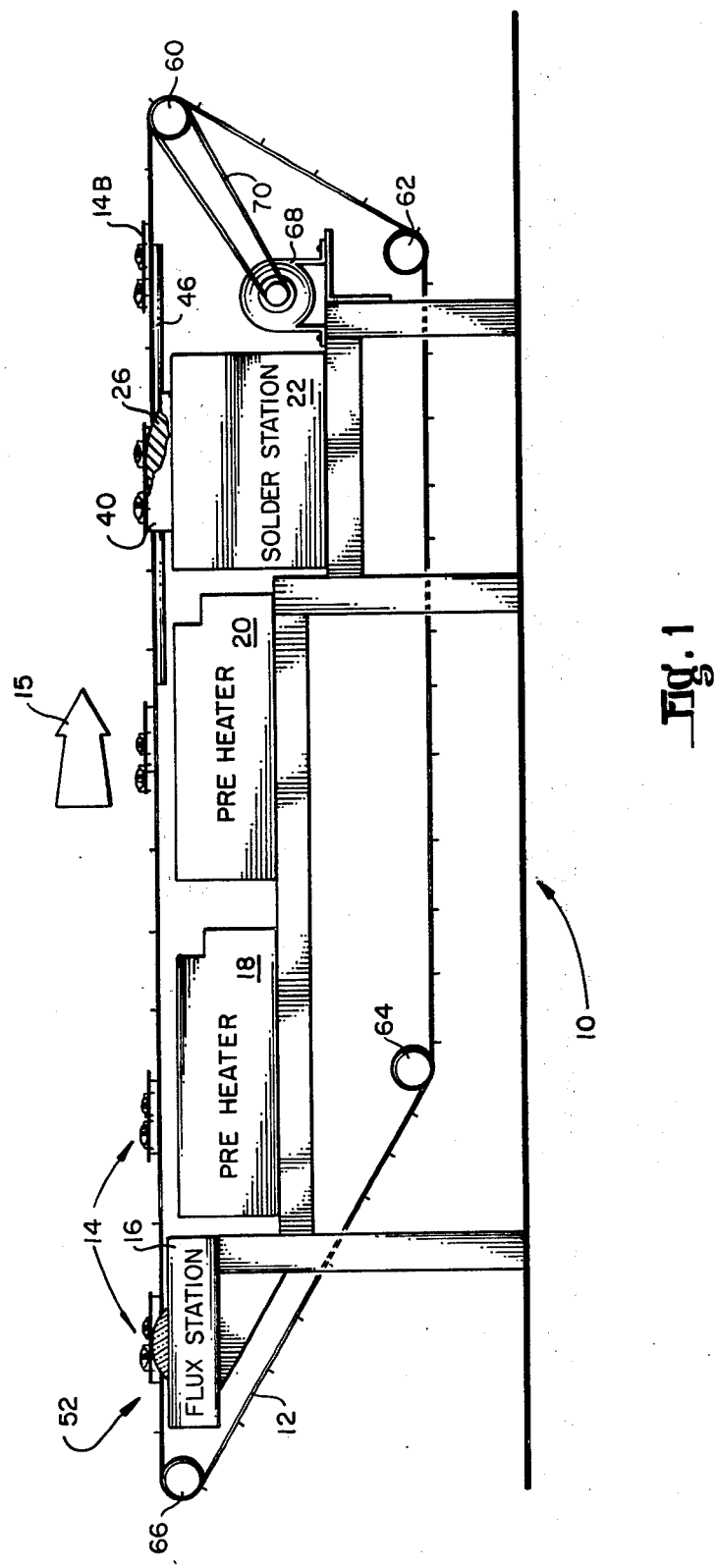

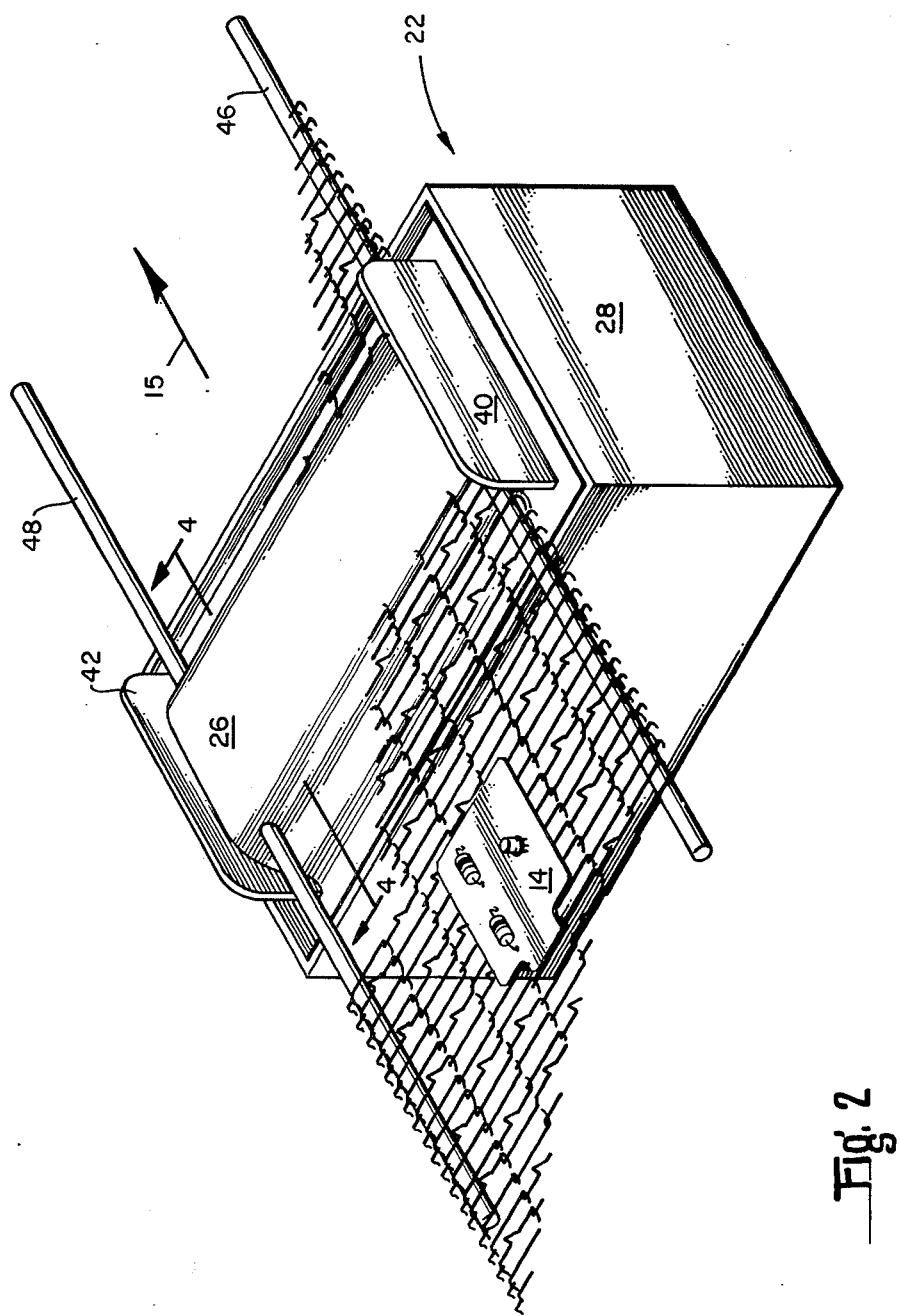

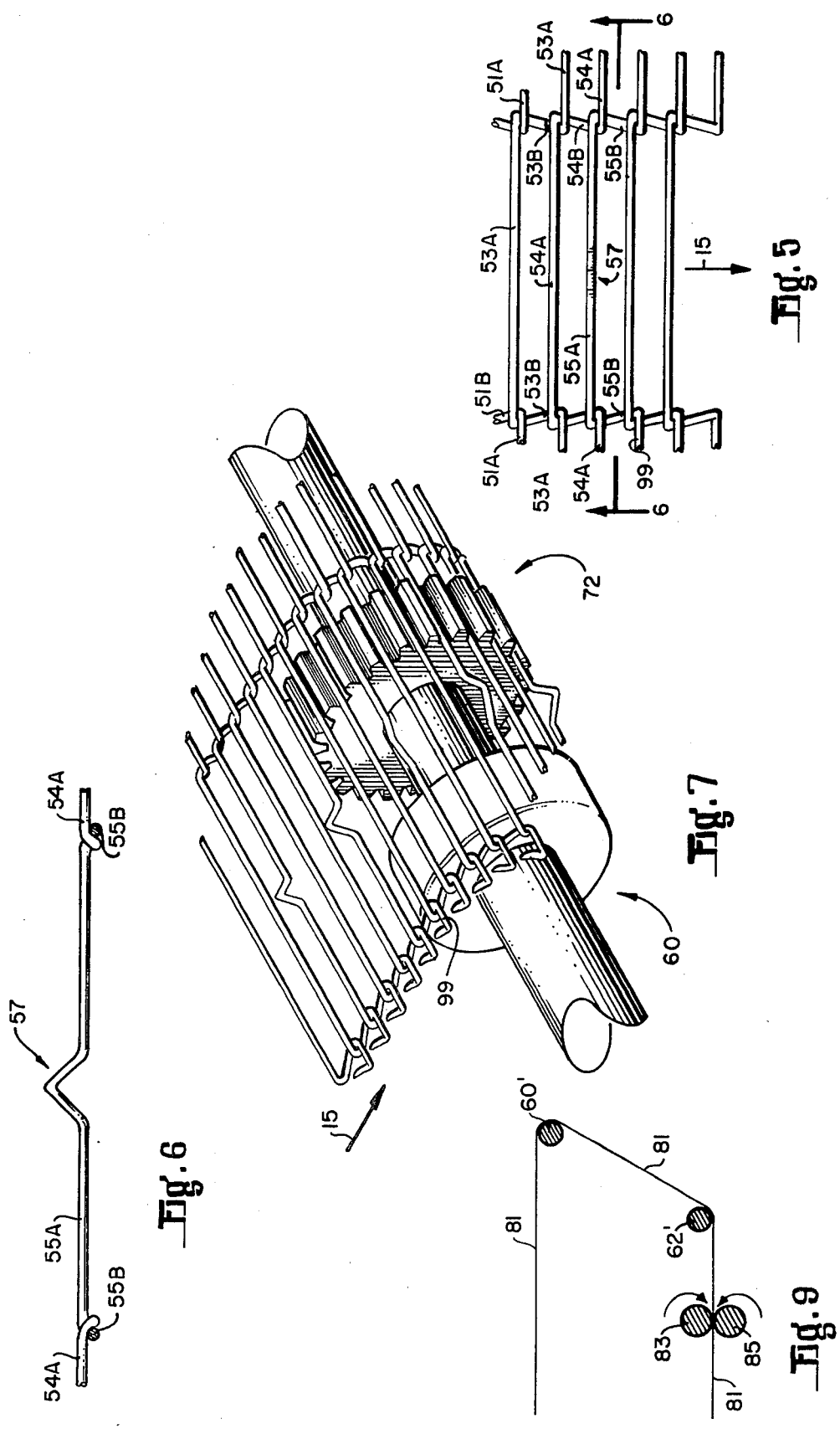

WAVE SOLDER MACHINE

BACKGROUND OF INVENTION

This invention relates to wave solder machines and more particularly to a wave solder machine for processing stuffed printed circuit (PC) boards of different and random sizes and shapes without the use of carriers for holding individual circuit boards.

A prior art method of producing circuit boards carrying electrical circuits is to assemble and process the boards on a progressive production line. Circuit boards having conductive traces thereon are located between a pair of tracks of a conveyor, which hold the boards by the edges thereof. As the tracks move the boards they are stuffed with components, fluxed, soldered, trimmed (the component leads thereon), and cleaned. In the wave solder machine in such a progressive line, the conveyor tracks hold the PC boards by edges thereof as the conveyor moves the undersides of the boards into contact with the solder wave. Such an assembly technique is only economically feasible when it is desirable to produce a large number of finished circuit boards having the same width.

In a prior-art wave solder machine for soldering component leads on circuit boards of size which occur in relatively small numbers, an operator must load the boards into carriers or racks having fixed outer dimensions and adjustable bars which hold the boards by edges thereof. Such a carrier is described in U.S. Pat. No. 3,930,644, issued Jan. 6, 1976 to E. V. Albert, Jr. The operator stuffs the racked circuit boards with components and then places the carriers on conveyor tracks of fixed dimensions which carry the undersides of the stuffed racked circuit boards into contact with the solder wave. The hand operations of loading circuit boards into and unloading them from such carriers involves considerable time and expense. The carriers themselves are also costly and require constant maintenance.

An object of this invention is the provision of an improved wave solder machine that is particularly adapted for economically and efficiently processing circuit boards of different sizes and shapes as well as large production runs of circuit boards of the same size.

SUMMARY OF THE INVENTION

In accordance with this invention, a wave solder machine comprises means for producing a wave of molten solder; means for supporting stuffed printed circuit boards in the machine by the undersides of the boards, the support means being elongated and extending through the solder wave in a prescribed direction; and means for moving the circuit boards on the support means in the prescribed direction with at least a portion of the undersides of the boards contacting the support means for causing the undersides of the boards to contact the molten solder wave as the boards pass the latter.

DESCRIPTION OF DRAWINGS

This invention will be more fully understood from the following detailed description together with the attached drawings in which:

FIG. 1 is a side elevation view of a wave solder machine 10 embodying this invention, with the side plate 40 broken away to show the solder wave 26;

FIG. 2 is an enlarged perspective view of the top of a portion of the machine in FIG. 1 with the belt 12 partially cut away over the solder station 22;

FIG. 5 is an enlarged top view of a portion of the belt 12;

FIG. 6 is an enlarged section view of the belt 12 taken along line 6—6 in FIG. 5 and in a direction opposite to the arrow 15 in FIGS. 2 and 5;

FIG. 7 is an enlarged perspective view of the belt on a drive roller 60;

FIG. 9 is an elevation view of the machine in FIG. 8 illustrating the drive and support mechanism for the wires 81 thereof;

DESCRIPTION OF PREFERRED EMBODIMENTS

Figure 4:
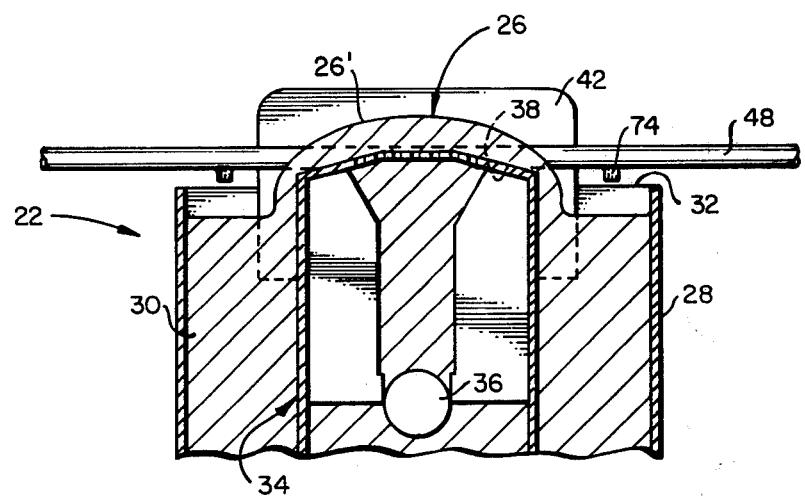
FIG. 4 is a section view of the solder station 22 taken along line 4—4 in FIGS. 2 and 3.

The wave solder machine 10 in FIG. 1 generally comprises an endless belt 12 which carries stuffed printed circuit boards 14 of different sizes and shapes in the direction of the arrow 15. The belt moves the boards 14 over a wave flux station 16, preheater stations 18 and 20, and a wave solder station 22 which produces a wave 26 of molten solder. The station 16 is conventional and may be any type of equipment for applying the flux to the bottom of a PC board 14 on the belt 12.

Figure 3:
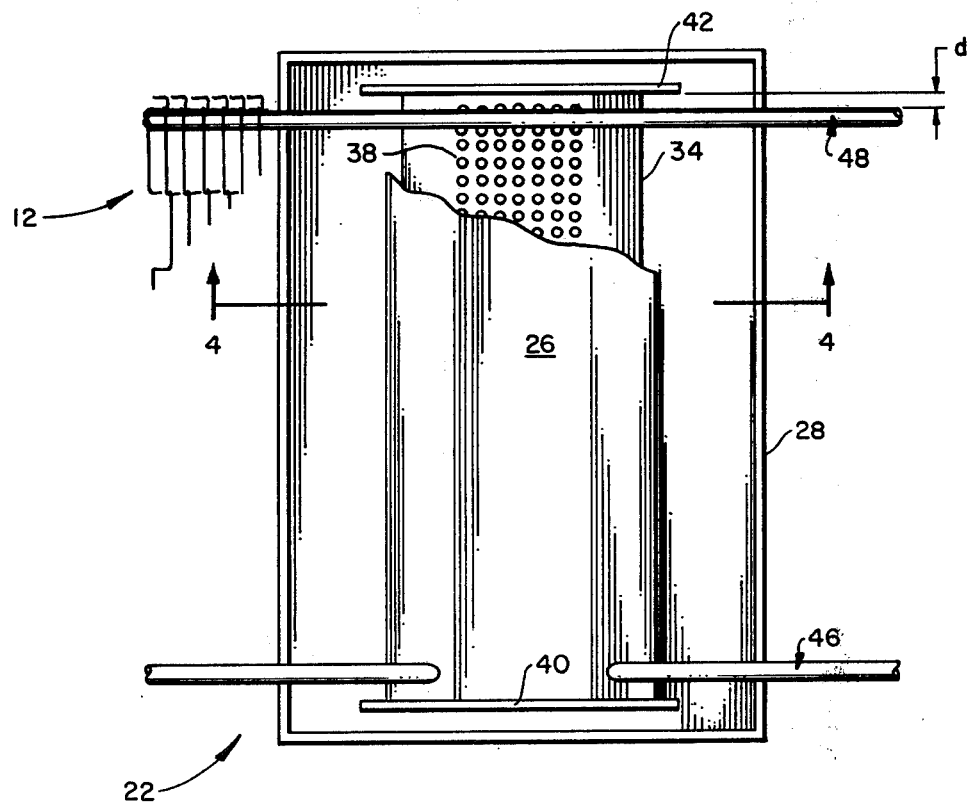
FIG. 3 is a top view of the solder station 22 in FIGS. 1 and 2.

The wave solder station 22 is shown in more detail in FIGS. 3 and 4. It generally comprises a pot 28 that is filled with molten solder 30 to a level below the top edge 32 thereof, and which has a container 34 supported therein. In operation, a pump 36 forces molten solder through apertures in a top plate 38 on the container to form the wave 26 which may be two inches wide and have a leading edge 26'. The breadth of the wave 26 is defined by the end plates 40 and 42 on the container 34. The wave may extend as much as an inch above plate 38. The station 22 is conventional except for the skids 46 and 48 which extend through the solder wave 26, and for the fact that belt 12 passes through the wave (see FIGS. 1 and 2). The skids 46 and 48 may be lengths of solid rod having key ways formed in the centers thereof, and fitting over the top 38 on the container 34. Alternatively, they may be supported in the solder wave by rigid metal bars that are attached to pot 28 and have right angle flanges on the ends thereof that are attached to the bottoms of the skids. The skids are oriented parallel to each other, spaced a prescribed distance d from associated end plates 40 and 42, and are secured to the container top 38 such as by screws (not shown).

As is described more fully hereinafter, the belt 12 is preferably a wire mesh screen (see FIG. 2) that is made of a nonsolderable material such as commercially pure titanium or a titanium alloy. Alternatively, the belt may be made of music wire. This makes it possible for the belt to be fluxed and then completely immersed in and passed directly through the solder wave 26 (as is illustrated in FIGS. 1 and 2) without solder adhering to it. The belt is preferably several inches wider than the widest printed circuit board to be processed by the machine 10.

Briefly, an operator normally loads stuffed printed circuit boards 14, one after the other, onto the left end 52 of the belt 12 by hand. Alternatively, stuffed circuit boards 14 may be loaded automatically onto the belt 12 from an adjacent belt (not shown). As the boards 14 move from left-to-right in FIG. 1, the station 16 applies solder flux on the undersides thereof to cause the solder to adhere to conductive circuit traces thereon. Since the belt 12 is made of a nonsolderable material, however, the solder will not adhere to the fluxed belt. The belt 12 and circuit boards 14 thereon are gradually heated in the conventional manner to higher temperatures by stations 18 and 20 so that they are more nearly the same temperature as the molten solder when the boards contact the wave 26. This reduces thermal shock in the boards as they come into contact with the solder wave 26. As the belt 12 passes through the solder wave (see FIG. 2), the underside of a circuit board 14 is gradually brought into contact with the solder over the full breadth of the board until the full area of the underside of the board has been brought into contact with the solder wave. Soldered circuit boards 14B on the right side of the belt in FIG. 1 pass over the roller 60 and onto another belt (not shown) which carries them to a cleaning operation.

The structure of belt 12 is preferably similar to that of the flat flex belt manufactured by the Wire Belt Company of America, Winchester, Mass. The flat flex belt is described in their catalog No. 72. The belt 12 here, however, is preferably made of a nonsolderable material.

The preferred embodiment of belt 12 is shown in more detail in FIGS. 2, 5, 6 and 7. The belt is comprised of a plurality of single lengths of wires which extend between the edges of the belt (see FIG. 2), portions of only a few such wires being shown in FIG. 5. The transverse portions of these wires designated by the letter A are parallel to each other and orthogonal to the arrow 15. Conversely, the short portions of these wires designated by the letter B are parallel to each other and arrow 15. Adjacent wires are securely threaded together, as is shown in FIG. 5, to form a flexible belt. A projection 47 which is preferably in the shape of an inverted V is formed in the transverse wire portion 55A. Other projections are periodically formed in other transverse wire portions as is shown in FIG. 2. These projections provide structure which contacts only a very small portion of the underside of a circuit board 14 and holds it above the major portion of the belt. As was stated previously, the belt 12 is preferably made of a nonsolderable material such as titanium. Similarly shaped belts which are made of solderable materials such as stainless steel have been used in other types of operation such as defluxing operations after wave solder, and have been used in reflow solder operations where the belts merely pass through ovens for reflowing the plated material on the traces of circuit boards having only conductive traces thereon and prior to soldering of components thereto. The belt does not come into contact with molten solder in such an operation. By way of example, the wires of belt 12 are made of 0.050 inch diameter titanium wire with a mesh size of 0.375 inch by 1.75 inches and inverted V's having a height and base length of 0.5 inch.

The belt 12 is supported on four or more rollers 60, 62, 64, and 66 as moving endless belt which is relatively flat over the top of the machine. Movement of the belt is provided by a gear motor 68 that is coupled through a chain 70, for example, to a drive roller 60 which is held in a fixed position. The roller 60, which is conventional and shown in more detail in FIG. 7, has several sprocket wheels 72 periodically located over the length of the belt. The truncated teeth in the sprocket wheels fit into the openings between adjacent transverse A wire portions. The teeth on the wheels 72 are preferably shorter than the height of the inverted V's 57, although this is not essential. The other rollers 62, 64 and 66 may be the same shape as the drive roller 60. The belt 12 may be maintained taut by connecting a spring type tensioning means (not shown) to the other rollers 34, 36 and 38. Since the circuit boards 14 are preferably stuffed with components having leads that are pre-trimmed to a length such as one-half inch, they only protrude about three-eighths inch below the underside of the circuit boards. This means that they extend only a short distance below the belt 12, if at all. It is not essential, however, that the leads be pre-trimmed to such a short length. The length of the belt between the solder wave 26 and roller 60 is set so that solder on circuit boards 14B is solidified before the boards 14B reach the roller 60.

In a machine such as is shown here, there will be some sag in the belt 12 between the rollers 60 and 66, and possibly between opposite edges thereof in FIG. 2. It is desirable that a circuit board be held as fast as possible as it contacts the solder wave. In order to make the belt 12 taut in the direction of travel and in the transverse direction as it passes through the solder wave 26, a pair of skids 46 and 48 are preferably located in the solder wave at opposite sides thereof (see FIGS. 2-4). Skids 46 and 48 are parallel to each other and to the arrow 15, and have top surfaces thereof in a common plane which is parallel to and below the surface of the solder wave 26. The skids are spaced a distance d away from associated plates 40 and 42, so as to support the belt 12 by contacting transverse A wires near the edges of the belt (see FIGS. 2 and 3). The skids may be steel rods having key ways in the center thereof that are fitted over the top of the container 34 in FIGS. 3 and 4. Alternatively, they may have a rectangular cross section with the top thereof rounded in the vicinity of the pot 28 to prevent molten solder in the wave running out of the pot. Vertical baffles 74 may also be formed over the side and bottom of the skids to cause the molten solder from the wave to fall back into the pot 28. The length of the skids are such that they support at least ten transverse A wires on either side of the wave. The skids are preferably at least three times the length of the longest PC board to be processed. Alternatively, they may extend over substantially the full length of the belt on top of the machine. The vertical height of the skids is selected to position the belt so that the tops of V's 57 are just below the surface of the wave 26 as the belt passes through it. The top surfaces of skids 46 and 48 are preferably made of tool steel for wear resistance. Alternatively, they may be covered with a heat resistant plastic to enhance sliding properties of the belt on them. The leading edges of the skids are rounded to facilitate the belt moving freely up onto the tops thereof.

Figure 8:
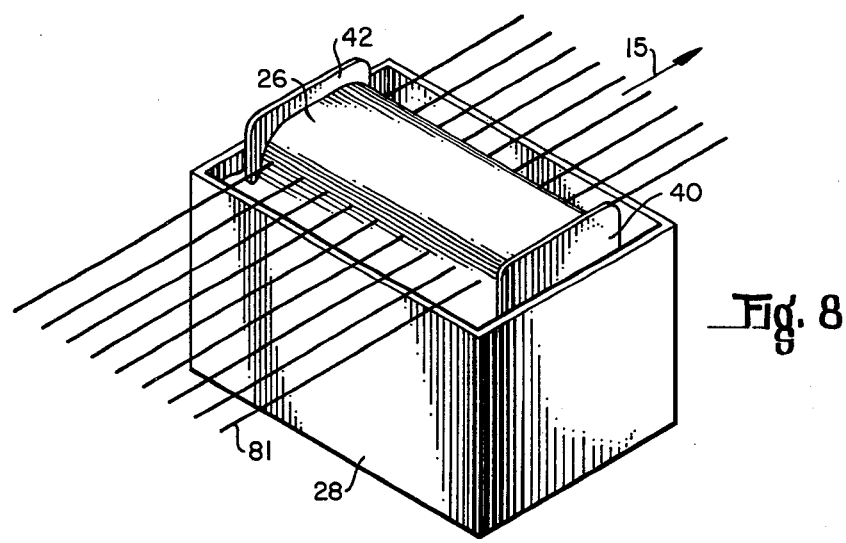
FIG. 8 is a perspective view of a portion of a wave solder machine embodying an alternate form of this invention.
Figure 10:
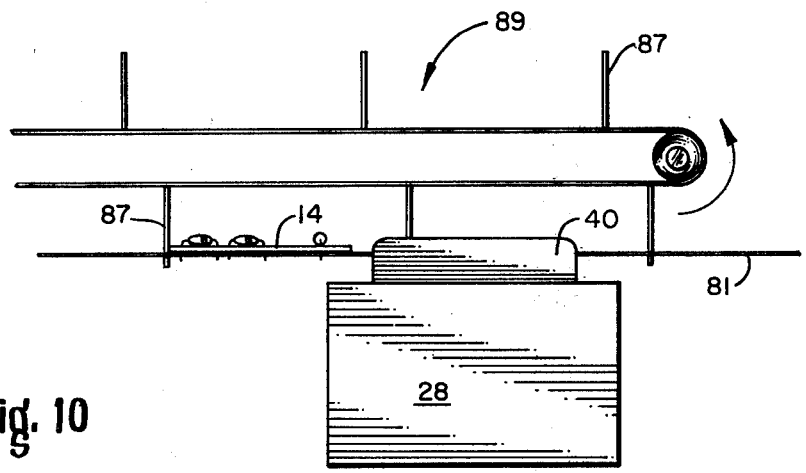
FIG. 10 is an elevation view of a portion of a machine including another embodiment of this invention.
Figure 11:
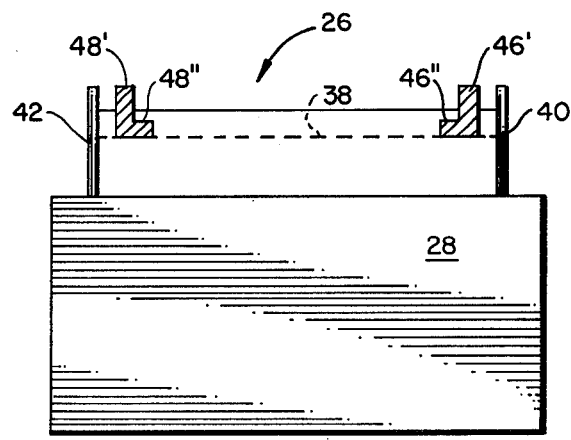
FIG. 11 is an elevation view, taken in the direction of arrow 15, of a machine including yet another embodiment of this invention.

Although this invention is described in relation to a preferred embodiment thereof, variations and modifications will occur to those skilled in the art without departing from the spirit of this invention. By way of example, finger structure may be employed to hold onto wires at the edge of the belt 12 over the length thereof to maintain it flat in the solder wave 26 instead of employing the skids 46 and 48. Such fingers could gradually fall away from the belt as it approached the roller 60. Also, the machine may be modified to include a pair of belts which are made of a solderable material such as stainless steel. The first belt then carries the boards through the fluxing operation and possibly the first preheat operation. The fluxed circuit boards are then automatically transferred to a second belt that passes through the solder wave. Since the second belt is not fluxed, the solder will have a lesser propensity to adhere to it. Further, the projections 57 supporting the undersides of the circuit boards above the major surface of the belt may be shaped other than as inverted V's. The projection may be generally curved or be vertical wires. Alternatively, the belt may be entirely devoid of such projections. The board will then rise slightly as it moves into contact with the solder wave 26 so as to expose the full underside of the board for soldering. Further, the carrier of circuit boards may be a plurality of endless moving parallel wires 81 in FIG. 8 that are made of a nonsolderable material such as music wire. The wire tension and the position of the solder wave 26 with respect to the end support rollers 60' and 66' (not shown) in FIG. 9 in such a machine are adjusted so that the lowest point on the wires is where they pass through the solder wave. The wires 81 may be moved by a pair of drive rollers 83 and 85 which rotate in opposite directions as shown in FIG. 9. Alternatively, the carrier may be stationary wires 81' that are parallel to each other with fingers 87 of an elevated conveyor 89 (see FIG. 10) pushing the boards 14 along the stationary wires 81' so that the undersides of the boards move into contact with the solder wave. Also, tracks 46' and 48' may be employed having facing sides thereof with portions cut away to form shoulders 46" and 48" (see FIG. 11) which support a circuit board thereon. These skids extend over the full length of the machine and the boards are pushed along the shoulders 46" and 48", for example, by fingers of an elevated conveyor as is shown in FIG. 10. The spacing between the skids is adjusted for the width of circuit boards to be processed. Further, the top of the belt 12 between rollers 60 and 66 in FIG. 1 may be inclined at an angle such as 6°, rather than being horizontal as is shown there. The scope of this invention is therefore to be determined from the attached claims rather than from the aforementioned detailed descriptions of preferred embodiments thereof.

What is claimed is:

1. In a wave solder machine for soldering leads of components stuffed in printed circuit (PC) boards to conductive patterns on the undersides of the boards and including means for producing a wave of molten solder having a width which is greater than a broad dimension of circuit boards to be soldered and having a length in a prescribed direction, the improvement comprising:
 a plurality of elongated wires which extend through the solder wave in the prescribed direction for supporting a stuffed circuit board located thereon by the underside of the board, said wires being at least generally parallel to each other; and
 means for moving the circuit board on said wires in the prescribed direction with at least a portion of the underside of the board contacting said wires for causing at least a portion of the underside of the board to contact the molten solder wave as the board passes over it.

2. The improvement according to claim 1 wherein the wires are made of a nonsolderable material.

3. The improvement according to claim 2 wherein said wires are stationary and said moving means causes a circuit board to move along the wires and the underside of the board to contact the solder wave.

4. The improvement according to claim 2 wherein said wires are formed in endless loops which are caused to move by said moving means to carry a board thereon so that the underside thereof moves into contact with the solder wave.

5. In a wave solder machine for soldering leads of components stuffed in printed circuit (PC) boards to conductive patterns on the undersides of the boards and including means for producing a wave of molten solder having a width that is greater than a broad dimension of circuit boards to be soldered and having a length in a prescribed direction, the improvement comprising:
 an elongated mesh belt for supporting a stuffed circuit board by the underside of the board, said belt extending through the solder wave in the prescribed direction with at least a portion of said belt being immersed in the solder wave; and
 means for moving said belt in the prescribed direction with portions of the underside of the board contacting said belt for causing at least a portion of the underside of the board to contact the molten solder wave as the belt passes through it.

6. The improvement according to claim 5 wherein said belt is formed in the shape of an endless loop, said belt being generally flat in a direction transverse to the prescribed direction.

7. The improvement according to claim 6 wherein said belt has a mesh size and shape that is sufficient for permitting the flow of solder into contact with the full breadth of the portion of the underside of the board that is available to contact the solder wave at any time.

8. The improvement according to claim 6 wherein said belt comprises a plurality of lengths of parallel wires, some of said wires having projections extending above the upper surface of the belt for contacting the underside of the circuit board and holding it above the upper surface of said belt.

9. The improvement according to claim 8 including means for causing at least several adjacent lengths of parallel wires of said belt that extend in a direction transverse to the prescribed direction and are proximate the leading edge of the solder wave to be generally in a common plane which extends through the solder wave.

10. The improvement according to claim 9 wherein said last named means comprises a pair of skids extending generally parallel to the prescribed direction, being immersed in the solder wave near opposite edges thereof, and having top surfaces extending under and contacting a plurality of parallel lengths of wires of said belt on both sides of the solder wave, the width of the belt being greater than the spacing between said skids.

11. The improvement according to claim 8 wherein said projections are generally inverted V's.

12. The improvement according to claim 11 wherein said belt is made of a nonsolderable material.

13. The improvement according to claim 12 wherein said belt is made of a material that is at least primarily titanium.

14. A wave solder machine comprising:
 means for producing a wave of molten solder;

an elongated mesh belt for supporting stuffed printed circuit boards in the machine by the undersides thereof, said belt being immersed in and extending through the solder wave in a prescribed direction; and means for moving the belt in the prescribed direction with portions of the undersides of circuit boards contacting said belt for causing the undersides of the boards to contact the molten solder wave as said belt moves through the solder wave and the boards move past it.

15. The improvement according to claim 14 wherein said belt is formed as an endless loop and comprises a plurality of lengths of parallel wires, said belt having projections formed on at least some of said wires and which extend above the upper surface of the belt for contacting the underside of a circuit board and holding it above the upper surface of said belt.

16. The improvement according to claim 15 including means for causing at least several adjacent lengths of parallel wires of said belt that extend in a direction generally transverse to the prescribed direction and are proximate the solder wave and on the leading edge thereof to be generally in a common plane which extends through the solder wave.

17. The method of soldering leads of components stuffed in printed circuit boards to conductive patterns on the underside of the boards comprising the steps of:
producing a wave of molten solder having a width that is greater than a broad dimension of a stuffed circuit board to be soldered;
supporting the stuffed circuit board on an elongated mesh belt with portions of the underside of the board contacting portions of the belt which is immersed in and extends through the solder wave in a prescribed direction; and
moving the belt in the prescribed direction so as to progressively pass all of the underside of the board into contact with the molten solder wave as the belt passes through it.

18. The method according to claim 17 in which the belt is formed in the shape of an endless loop and is generally flat in a direction transverse to the prescribed direction; the belt having a plurality of lengths of parallel wires, some of which have projections extending above the upper surface of the belt for contacting the underside of a circuit board and holding it above the upper surface of the belt.

19. The method according to claim 18 including the additional step of supporting a plurality of adjacent lengths of parallel wires of said belt that extend in a direction transverse to the prescribed direction and are proximate the leading edge of the solder wave for causing them to be generally in a common plane which extends through the solder wave.

20. The method according to claim 19 in which the plurality of wires are supported by a pair of skids extending generally parallel to the prescribed direction, being immersed in the solder wave near opposite edges thereof, and having top surfaces extending under and contacting a plurality of parallel lengths of wires of the belt on both sides of the solder wave, the width of the belt being greater than the spacing between the skids; and in which the belt is made of a nonsolderable material such as titanium.

* * * * *